United States Patent
Yang et al.

(10) Patent No.: US 7,626,823 B2
(45) Date of Patent: Dec. 1, 2009

(54) HEAT SINK ASSEMBLY

(75) Inventors: Jian Yang, Shenzhen (CN); Jing Zhang, Shenzhen (CN)

(73) Assignees: Fu Zhun Precision Industry (Shen Zhen) Co., Ltd., Shenzhen, Guangdong Provine (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/143,849

(22) Filed: Jun. 23, 2008

(65) Prior Publication Data

US 2009/0257197 A1    Oct. 15, 2009

(30) Foreign Application Priority Data

Apr. 11, 2008    (CN) .................. 2008 1 0066577

(51) Int. Cl.
*H05K 7/20*    (2006.01)
(52) U.S. Cl. .................. 361/719; 361/704; 361/715; 257/718; 257/719
(58) Field of Classification Search .................. None
See application file for complete search history.

(56) References Cited

U.S. PATENT DOCUMENTS

| | | | |
|---|---|---|---|
| 6,535,387 B2 * | 3/2003 | Summers et al. | 361/704 |
| 7,312,996 B2 * | 12/2007 | Chang | 361/704 |
| 7,349,220 B2 * | 3/2008 | Lai et al. | 361/719 |
| 7,400,506 B2 * | 7/2008 | Hoss et al. | 361/715 |
| 2003/0026076 A1 * | 2/2003 | Wei | 361/704 |
| 2009/0103269 A1 * | 4/2009 | Liu et al. | 361/719 |

\* cited by examiner

*Primary Examiner*—Boris L Chervinsky
(74) *Attorney, Agent, or Firm*—Frank R. Niranjan

(57) ABSTRACT

A heat sink assembly includes a first heat sink, a second heat sink, and a wire clip connecting the first and second heat sinks together. Each of the first and second heat sinks includes a base and a plurality of connecting members extending upwardly from the base. The wire clip includes a pivot portion and a pair of pressing portions extending from opposite ends of the pivot portion towards each other. The connecting members of the first and second heat sinks cooperatively clasp the pivot portion of the wire clip. The pressing members of the wire clip resiliently abut against the connecting members of the first and second heat sinks and push the connecting members of the first and second heat sink outwardly away from each other. The bases of the first and second heat sinks clamp an add-on card therebetween.

16 Claims, 6 Drawing Sheets

HEAT SINK ASSEMBLY

BACKGROUND OF THE INVENTION

1. Field of the Invention

The present invention relates to a heat sink assembly, and more particularly to a heat sink assembly having a wire clip and a pair of heat sinks, wherein the wire clip and the heat sinks are assembled together to dissipate heat generated by electronic components mounted on an add-on card module.

2. Description of Related Art

Advances in microelectronics technology have resulted in add-on cards which process signals and data at unprecedented high speeds. During operation of many contemporary add-on cards such as memory module, large amounts of heat are produced. The heat must be efficiently removed, to prevent the system from becoming unstable or being damaged.

A conventional heat sink assembly is used to dissipate heat generated by the add-on cards. The heat sink assembly comprises a heat sink mounted on an outer surface of the add-on card and a U-shaped clip clamping the heat sink and another outer surface of the add-on card to mount the heat sink on the add-on card. The clip in this kind of assembly is a discrete part which must be packed and transported separately. The clip takes up additional transportation space. Furthermore, it is not convenient to operate the clip to mount the heat sink on the add-on card because the space between the and an adjacent add-on cards is usually so narrow that the clip is prone to interfere with the adjacent add-on card.

An improved heat sink assembly, which overcomes the above problems, is desired.

SUMMARY OF THE INVENTION

A heat sink assembly includes a first heat sink, a second heat sink, and a wire clip connecting the first and second heat sinks together. The first heat sink includes a base and a plurality of connecting members extending upwardly from the base. The second heat sink includes a base and a plurality of connecting members extending upwardly from the base. The wire clip includes a pivot portion and a pair of pressing portions extending from opposite ends of the pivot portion towards each other. The pressing portions are located above and at opposites of the pivot portion. The connecting members of the first and second heat sinks cooperatively clasp the pivot portion of the wire clip. The pressing members of the wire clip resiliently abut against the connecting members of the first and second heat sinks and push them outwardly along opposite directions. The bases of the first and second heat sinks clamp an add-on card therebetween.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
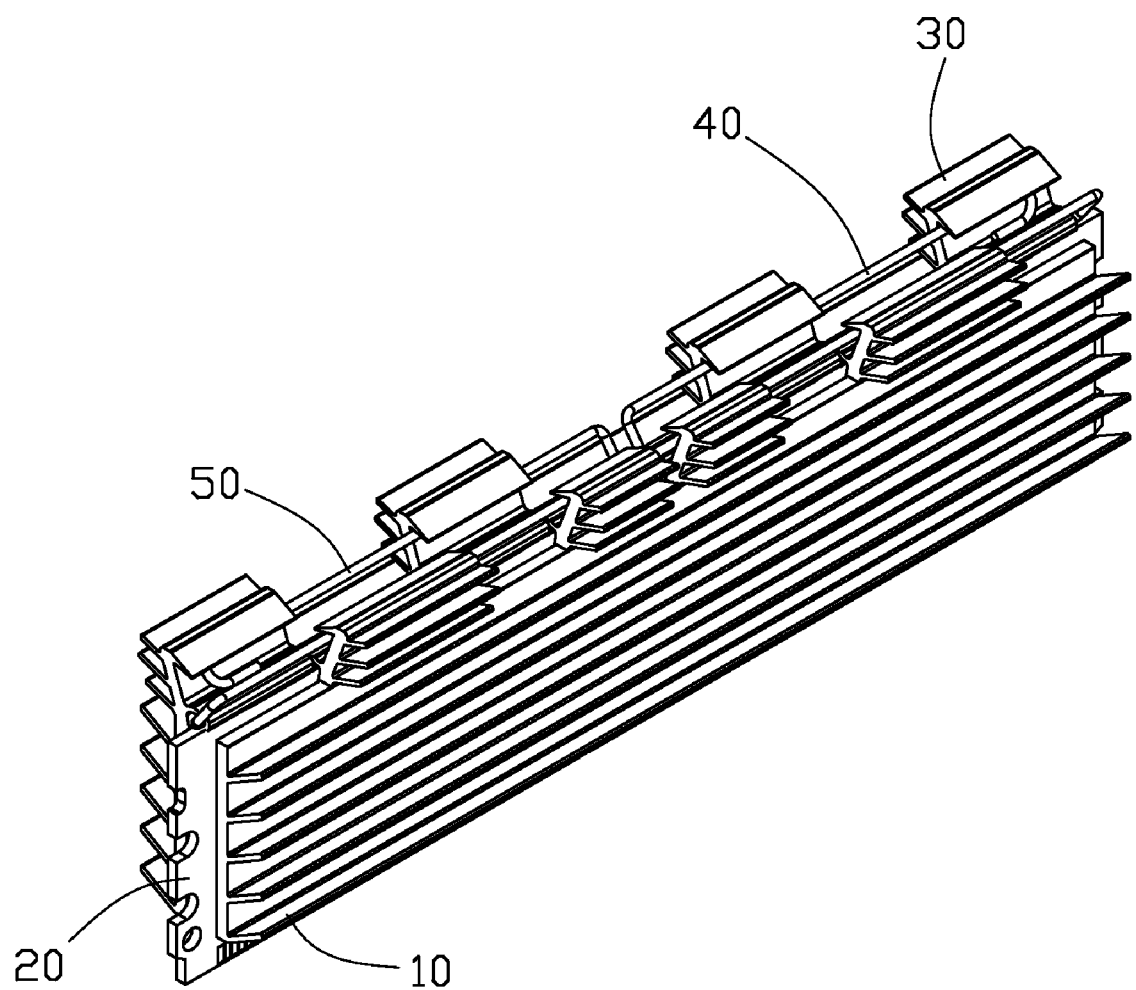
FIG. 1 is an assembled, perspective view of a heat sink assembly in accordance with a preferred embodiment of the present invention, the heat sink assembly being assembled to an add-on card.
Figure 2:
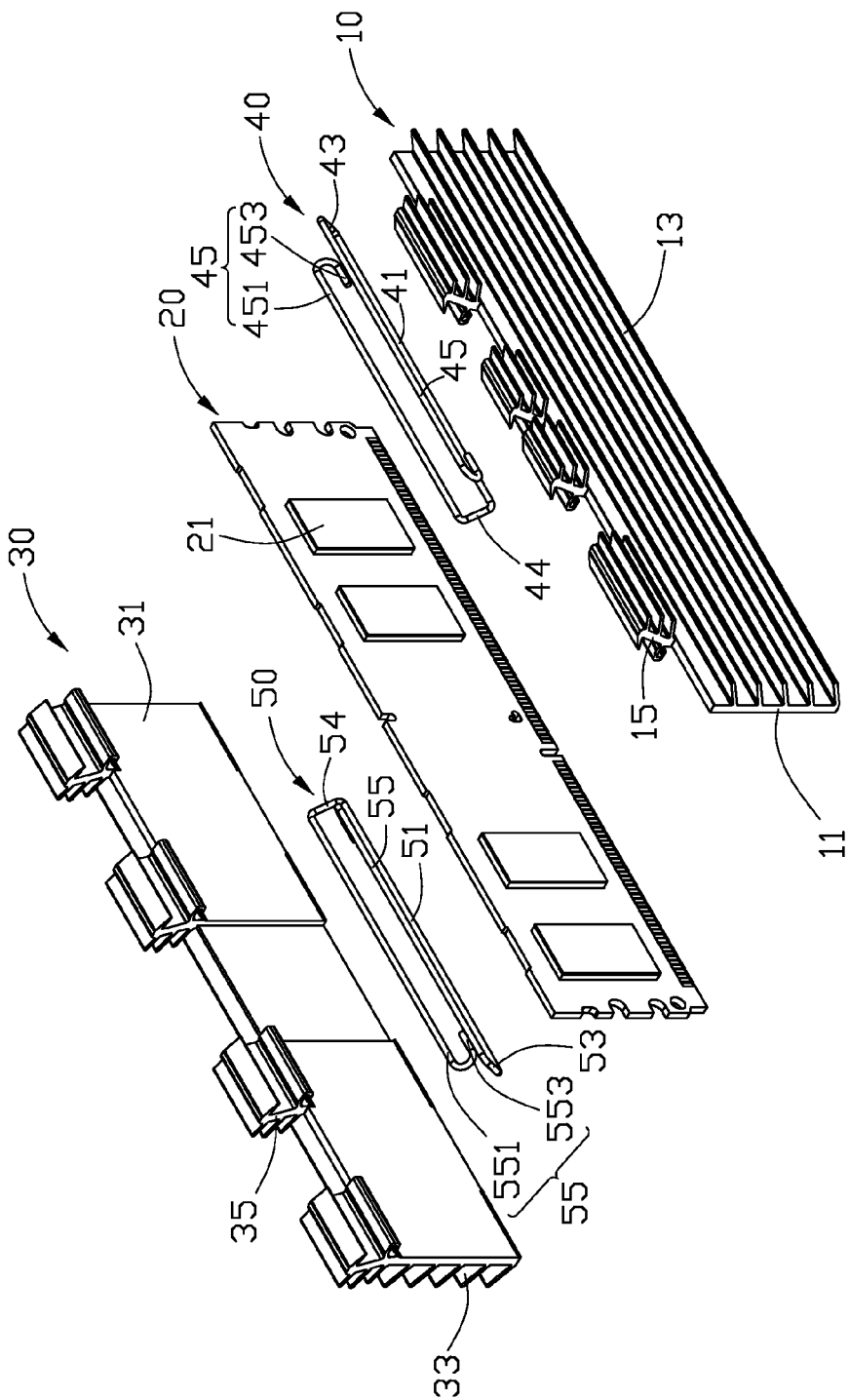
FIG. 2 is an exploded view of FIG. 1.

Referring to FIGS. 1-2, they illustrate a heat sink assembly (not labeled) for dissipating heat generated by electronic components 21 mounted on an add-on card 20. The heat sink assembly comprises a first heat sink 10, a second heat sink 30, a first clip 40, and a second clip 50. The first and second heat sinks 10, 20 are located at a front side and a rear side of the add-on card 20, respectively. The first and second clips 40, 50 connect with the first and second heat sinks 10, 30 to make the first and second heat sinks 10, 30 intimately contact with the electronic components 21 of the add-on card 20.

The first clip 40 is made of a single spring wire. The first clip 40 comprises an elongated straight pivot portion 41, a first connecting portion 43 and a second connecting portion 44 slantwise extending upwardly and outwardly from opposite ends of the pivot portion 41, and a pair of pressing portions 45 extending toward each other from top ends of the first and second connecting portions 43, 44 respectively. The pivot portion 41 is used to extend through the first and second heat sinks 10, 30 to assemble the first and second heat sinks 10, 30 together. The first and second connecting portions 43, 44 are angled with each other. The first connecting portion 43 is shorter than the second connecting portion 44. Each pressing portion 45 has an L-shaped configuration and comprises an elongated straight engaging portion 451 and a bended hooked portion 453 extending inwardly from a free end of the engaging portion 451. The engaging portions 451 of the pressing portions 45 are located in the same level and parallel to each other. The engaging portions 451 are located at opposite sides of the pivot portion 41 and parallel to the pivot portion 41. The pressing portions 45 are used to press against the first and second heat sinks 10, 30, respectively.

The second clip 50 has a configuration similar to the first clip 40. The second clip 50 is made of a single spring wire. The second clip 50 comprises an elongated, straight pivot portion 51, a first connecting portion 53 and a second connecting portion 54 slantwise extending upwardly and outwardly from opposite ends of the pivot portion 51, and a pair of pressing portions 55 extending from top ends of the first and second connecting portions 53, 54 respectively and towards each other. The pivot portion 51 is used to extend through the first and second heat sinks 10, 30 to assemble the first and second heat sinks 10, 30 together. The first and second connecting portions 53, 54 are angled with each other. The first connecting portion 53 is shorter than the second connecting portion 54. A length of the first connecting portion 53 is equal to that of the first connecting portion 43 of first clip 40. A length of the second connecting portion 54 is equal to that of the second connecting portion 44 of the first clip 40. The second connecting portion 54 of the second clip 50 is adjacent to the second connecting portion 44 of the first clip 40. Each pressing portion 55 has an L-shaped configuration and comprises an elongated straight engaging portion 551 and a bended hooked portion 553 extending inwardly from an end of the engaging portion 551 The engaging portions 551 of the pressing portions 55 are located in the same level and parallel to each other. The engaging portions 551 are located at opposite sides of the pivot portion 51 and parallel to the pivot portion 51. The pressing portions 55 are used to press against the first and second heat sinks 10, 30, respectively.

The first heat sink 10 comprises a rectangular base 11, four connecting members 15 extending upwardly from a top edge of the base 11, and a plurality of spaced fins 13 extending outwardly from outer surfaces (not labeled) of the base 11 and the connecting members 15. An inner surface of the base 11 is used for intimately contacting with the electronic components 21 of the add-on card 20. The connecting members 15 are spaced from each other. A pair of connecting members 15 are located at a centre of the top edge of the base 11 and another pair of connecting members 15 are located near opposite ends of the base 11.

Figure 3:
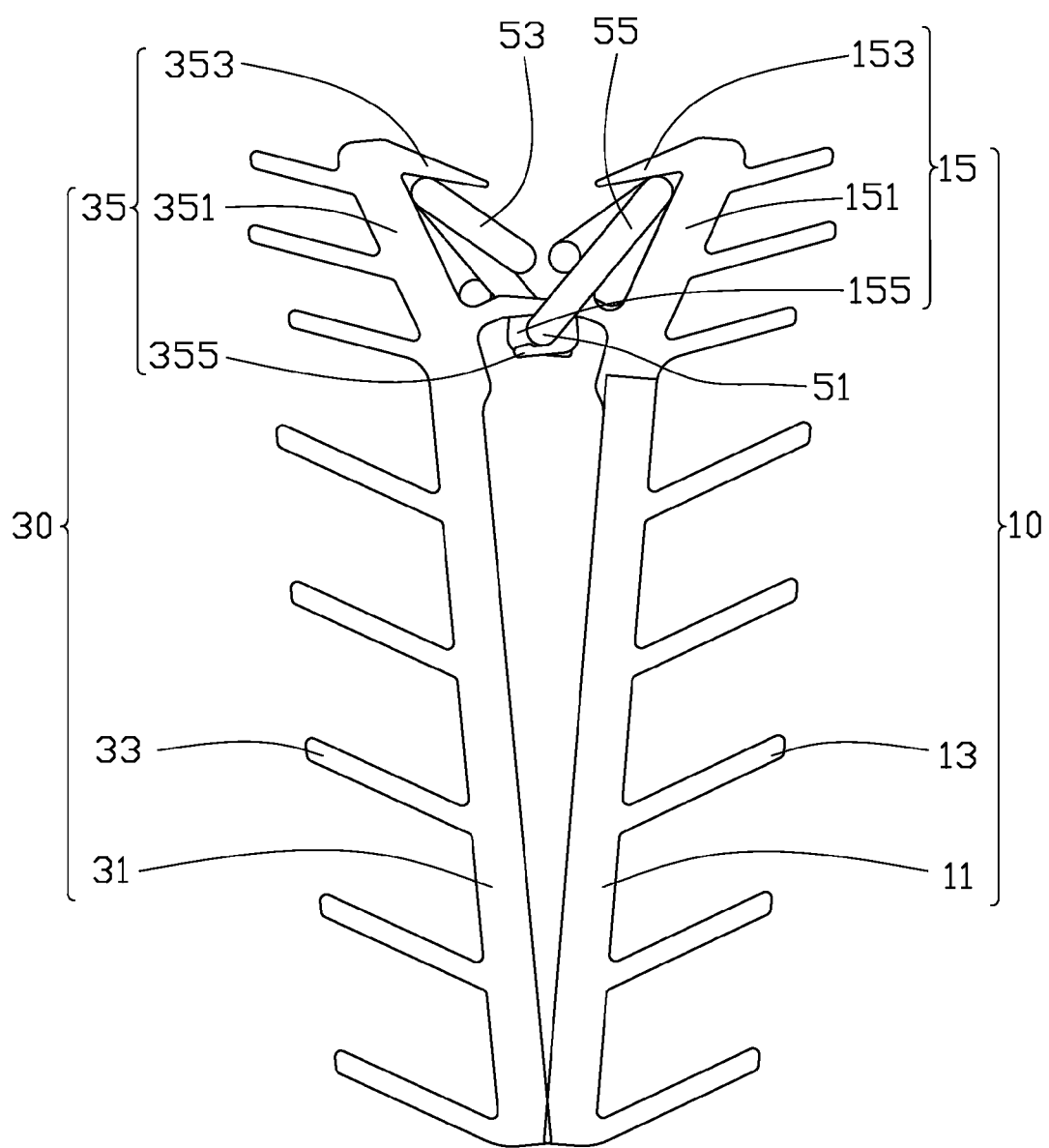
FIG. 3 is an assembled, side elevational view of the heat sink assembly.
Figure 6:
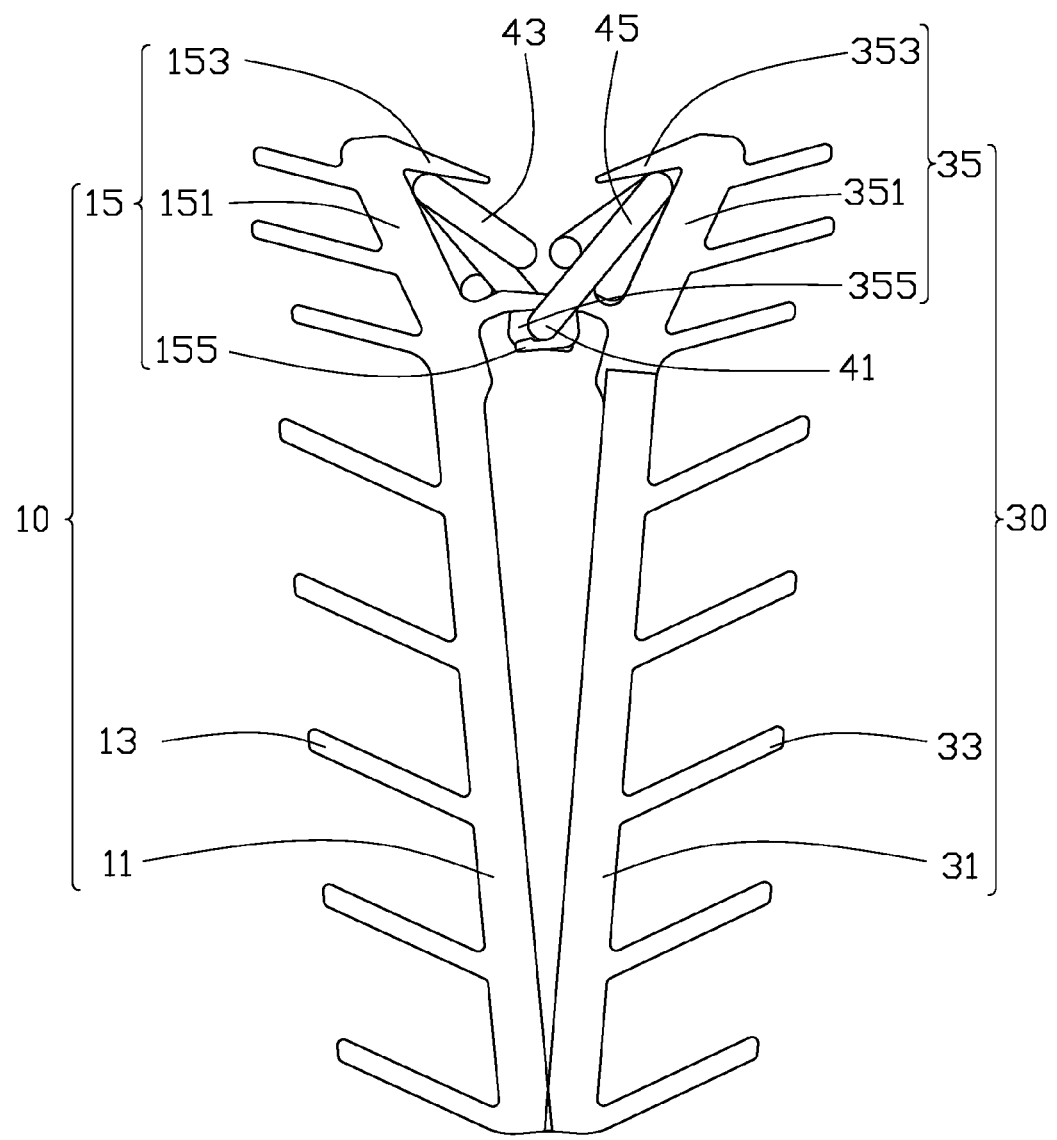
FIG. 6 is a view similar to FIG. 3, but viewed from an opposite direction thereof.

Referring to FIG. 3 and FIG. 6 also, each connecting member 15 comprises a rectangular extending plate 151 extending slantwise and outwardly from the top edge of the base 11, a baffling plate 153 extending slantwise and inward from a top end of the extending plate 151, and a support 155 extending inward from a bottom portion of the extending plate 151. The support 155 is U-shaped. The support 155 extends from an inner surface (not labeled) of the extending plate 151.

The second heat sink 30 is similar to the first heat sink 10. The second heat sink 30 comprises a rectangular base 31, four connecting members 35 extending upwardly from a top edge of the base 31, and a plurality of spaced fins 33 extending outwardly from outer surfaces (not labeled) of the base 31 and the connecting members 35. An inner surface of the base 31 is used for intimately contacting with the electronic components 21 of the add-on card 20. The connecting members 35 are evenly spaced from each other.

Each connecting member 35 comprises a rectangular extending plate 351 extending slantwise and outwardly from the top edge of the base 31, a baffling plate 353 extending slantwise and inward from a top end of the extending plate 351, and a support 355 extending inward from a bottom portion of the extending plate 351. The support 355 is U-shaped.

In assembly of the first, second clips 40, 50 and the first and second heat sinks 10, 30, the supports 155 are brought to clasp the pivot portions 41, 51 of the first and second clips 40, 50 along a rear-to-front direction of the heat sink assembly. Meanwhile, the pressing portions 45, 55 of the first and second clips 40, 50 located near the first heat sink 10 are received in corners defined by the extending plates 151 and the baffling plates 153 of the first heat sink 10. The supports 355 are then brought to clasp the pivot portions 41, 51 of the first and second clips 40, 50 along the front-to-rear direction of the heat sink assembly. Thus, the pressing portion 55 and the pressing portion 45 of the second and first clips 50, 40 which are located near the second heat sink 30 are received in corners defined by the extending plates 351 and the baffling plates 353 of the second heat sink 30. As the supports 155, 355 clasp the pivot portions 41, 51 together in a line, since a distance between the corners of the extending plates 351 and the baffling plates 353 of the second heat sink 30 and the extending plates 151 and the baffling plates 153 of the first heat sink 10 is shorter than a distance between the pressing portions 45 of the first clip 40 and a distance between the pressing portions 55 of the second clip 55 when the first and second clips 40, 50 are at a natural state, the pressing portions 45, 55 resiliently push the extending plates 151, 351 away from each other. At this position, bottom edges of the bases 11, 31 engage with each other, as shown in FIGS. 3 and 6. Accordingly, the first, second heat sinks 10, 30 and the first, second clips 40, 50 are assembled together. In this state, the connecting members 15, 35 of the first and second heat sinks 10, 30 are alternately arranged; simultaneously, the supports 155, 355 cooperatively define a linear channel (not labeled) receiving the pivot portions 41, 51 of the first and second clips 40, 50 therein.

When the heat sink assembly is at the assembled position, the pivot portions 41, 51 of the first and second clips 40, 50 are received in the channel defined by the supports 155, 355 of the connecting members 15, 35 of the first and second heat sink 10, 30. The pressing portions 45, 55 of the first and second clips 40, 50 are pressed toward each other by the connecting members 15, 35 of the first and second heat sinks 10, 30 from opposite directions. The bottom edge of the base 11 of the first heat sink 10 abuts against the bottom edge of the base 31 of the second heat sink 30.

Figure 4:
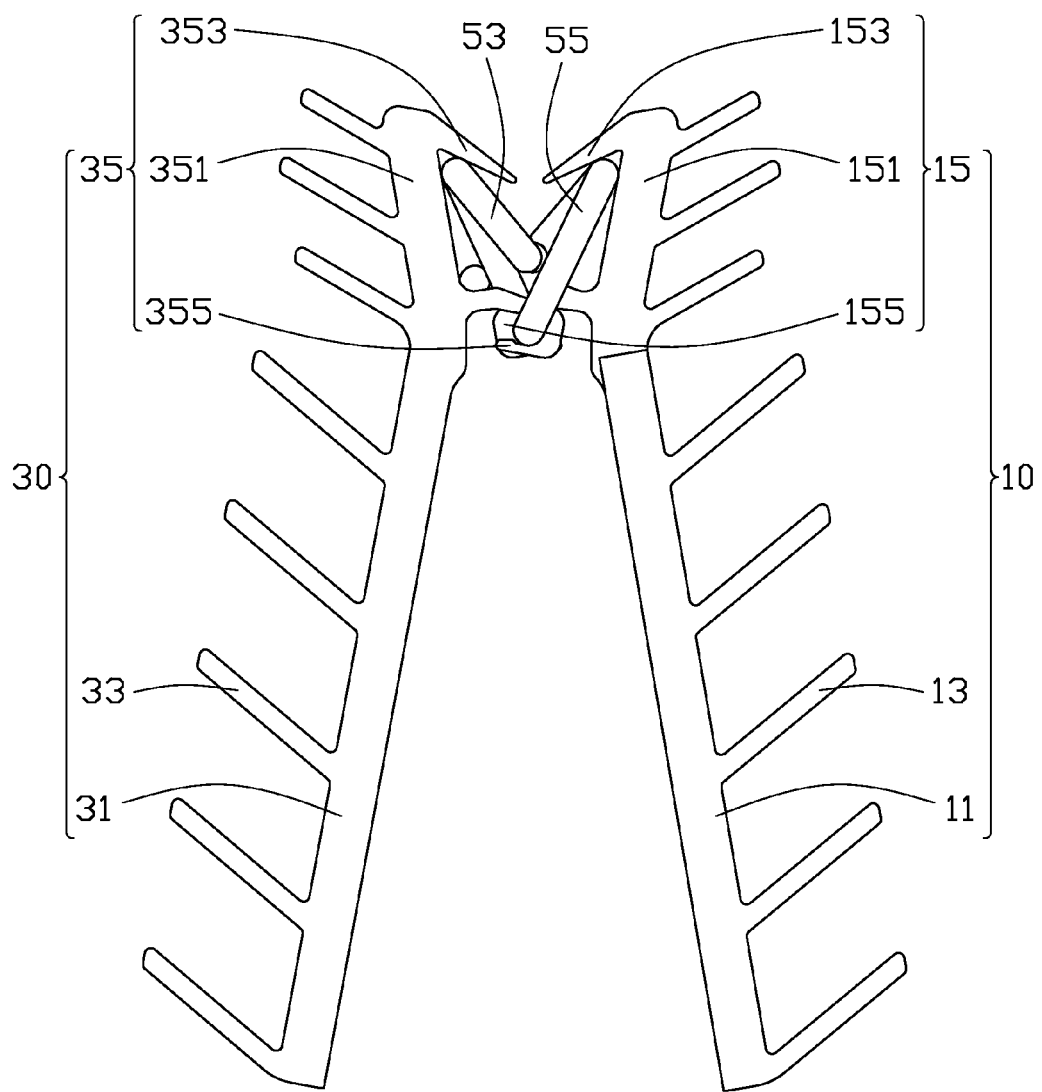
FIG. 4 is an assembled, side elevational view of the heat sink assembly, wherein bases of first and second heat sinks of the heat sink assembly are moved to separate from each other in order to receive the add-on card therebetween.

Referring to FIG. 4, in operation of the heat sink assembly in order to receive the add-on card 20 between the first and second heat sinks 10, 30, the extending plates 151, 351 of the first and second heat sinks 10, 30 are pressed inwardly toward each other so that the extending plates 151, 351 move close to each other, and the bases 11, 31 of the first and second heat sinks 10, 30 move away from each other. In this state, the connecting portions 15, 35 of the first and second heat sinks 10, 30 are near to each other; the pressing portions 45, 55 of the first and second clips 40, 50 are further compressed and resiliently abuts against the connecting members 15, of the first and second heat sinks 10, 30; the bases 11, 31 are spaced from each other. In this state, the heat sink assembly is ready to be assembled with the add-on card 20. The movement of the connecting members 15, 35 and the bases 11, 31 are pivotable about the pivot portions 41, 51 of the first and second clips 40, 50.

Figure 5:
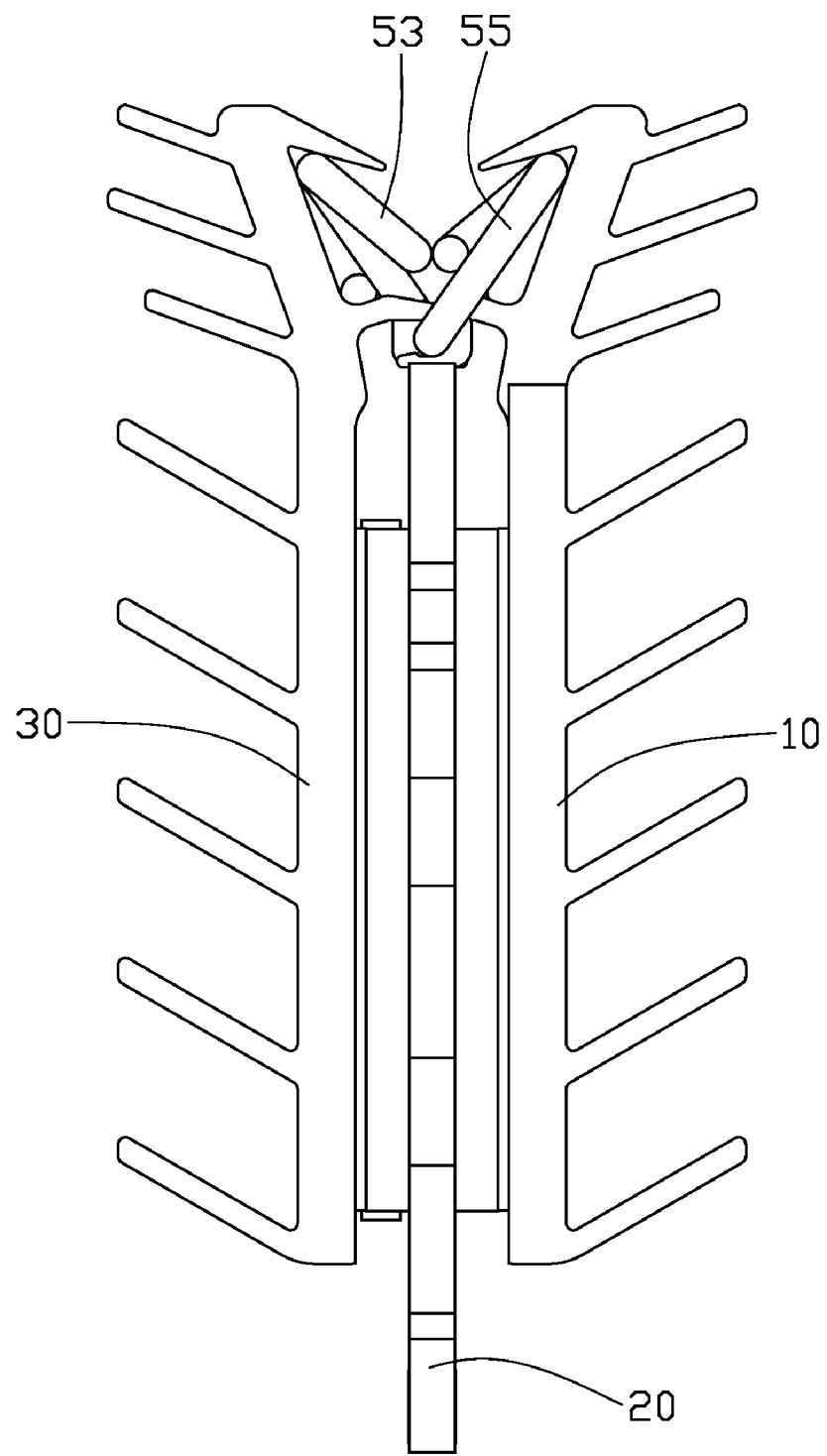
FIG. 5 is a side elevational view of FIG. 1.

Referring to FIG. 5, when the add-on card 20 is inserted into a space between the bases 11, 31 of the first and second heat sinks 10, 30 of FIG. 4, the clamping force acting on the connecting portions 15, 35 is released so that the bases 11, 31 are moved toward each other under the action of the spring force generated by the pressing portions 45, 55 of the first and second clips 40, 50 acting on the extending plates 151, 351. The add-on card 20 is thus sandwiched between first and second heat sinks 10, 30 of heat sink assembly. The bases 11, 31 move towards the add-on card 20 to intimately contact with the electronic components 21 on the add-on card 20. Accordingly, heat generated by the electronic components 21 is absorbed and dissipated by the first and second heat sinks 10, 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly, adapted for dissipating heat generated by electronic components mounted on an add-on card, comprising:
   a first heat sink comprising a base and a plurality of connecting members extending upwardly from the base;
   a second heat sink comprising a base and a plurality of connecting members extending upwardly from the base of the second heat sink; and
   a wire clip comprising a pivot portion and a pair of pressing portions extending from opposite ends of the pivot portion towards each other, the pressing portions being located above and at opposite sides of the pivot portion, the pressing portions being spaced a distance from each other;

wherein the connecting members of the first and second heat sinks cooperatively clasp the pivot portion of the wire clip and the pressing members of the wire clip resiliently abut against the connecting members of the first and second heat sinks and push the connecting members of the first and second heat sinks outwardly away from each other, the bases of the first and second heat sinks being adapted for clamping the add-on card therebetween.

2. The heat sink assembly as claimed in claim 1, wherein each of the connecting members of the first and second heat sinks comprises an extending plates extending upwardly from an upper edge of a corresponding base, a baffling plate extending slantwise downwardly and inwardly from a top portion of the extending plate, and a support extending inwardly from a bottom portion of the extending plate, the pivot portion being received in the supports of the first and second heat sinks, the pressing portions of the clip pressing the extending plates outwardly and the baffling plates abutting against the pressing portions downwardly.

3. The heat sink assembly as claimed in claim 2, wherein the connecting members are alternately arranged.

4. The heat sink assembly as claimed in claim 2, wherein each of the supports of the first and second heat sinks has a U-shaped configuration.

5. The heat sink assembly as claimed in claim 2, wherein a plurality of fins extends outwardly from outer surfaces of the of the first and second heat sinks.

6. The heat sink assembly as claimed in claim 1, wherein each of the pressing portions has an L-shaped configuration and comprises an elongated straight engaging portion and a bended hooked portion extending from an end of the straight portion.

7. The heat sink assembly as claimed in claim 6, wherein the engaging portions of the pressing portions are parallel to the pivot portion and located in a same level.

8. The heat sink assembly as claimed in claim 6, wherein a first connecting portion and a second connecting portion extend slantwise upwardly from the opposite ends of the pivot portion and connect with the pressing portions.

9. The heat sink assembly as claimed in claim 8, wherein the first and second connecting portions are angled with each other.

10. The heat sink assembly as claimed in claim 8, wherein the first connecting portion is shorter than the second connecting portion.

11. An add-on card module comprising:
a heat sink assembly comprising:
a first heat sink comprising a base and a plurality of connecting members extending upwardly from the base;
a second heat sink comprising a base and a plurality of connecting members extending upwardly from the base of the second heat sink; and
a wire clip comprising a pivot portion connecting with the connecting members of the first and second heat sinks and a pair of pressing portions extending from opposite ends of the pivot portion, one of the pressing portions of the wire clip resiliently abutting against the connecting member of the first heat sink and the other pressing portion of the wire clip resiliently abutting against the connecting member of the second heat sink, the pressing portions pushing the connecting members outwardly away from each other; and
an add-on card comprising a plurality of electronic components mounted on opposite surfaces thereof;
wherein the add-on card is sandwiched between the bases of the first and second heat sinks of the heat sink assembly, and the first and second heat sinks intimately contact with the electronic components of the add-on card.

12. The add-on card module as claimed in claim 11, wherein each of the connecting members of the first and second heat sinks comprises an extending plates extending upwardly from an upper edge of a corresponding base, a baffling plate extending slantwise towards the add-on card from a top portion of the extending plate, and a support forming from a bottom portion of the extending plate, the pivot portion being received in the supports of the first and second heat sinks, the pressing portions of the clip pressing the extending plates outwardly, the baffling plates abutting against the pressing portions downwardly.

13. The add-on card module as claimed in claim 12, wherein the connecting members are alternately arranged.

14. The add-on card module as claimed in claim 1, wherein each of the pressing portions has an L-shaped configuration and comprises an elongated engaging portion and a bended hooked portion extending from an end of the straight portion.

15. The add-on card module as claimed in claim 11 further comprising another wire clip connecting with the heat sink assembly, the another wire clip comprising a pivot portion connecting with the connecting members of the first and second heat sinks and a pair of pressing portions extending from opposite ends of the pivot portion of the another wire clip, the pressing portions of the another wire clip pressing the connecting members of the first and second heat sinks outwardly away from each other.

16. The add-on card module as claimed in claim 1, wherein the wire clip is aligned with the another wire clip.

* * * * *